US011296662B2

(12) United States Patent
Sasaki (10) Patent No.: US 11,296,662 B2
(45) Date of Patent: Apr. 5, 2022

(54) HIGH-FREQUENCY POWER AMPLIFIER

(71) Applicant: Mitsubishi Electric Corporation, Tokyo (JP)

(72) Inventor: Yoshinobu Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 36 days.

(21) Appl. No.: 16/979,631

(22) PCT Filed: Apr. 16, 2018

(86) PCT No.: PCT/JP2018/015689
§ 371 (c)(1),
(2) Date: Sep. 10, 2020

(87) PCT Pub. No.: WO2019/202631
PCT Pub. Date: Oct. 24, 2019

(65) Prior Publication Data
US 2021/0044261 A1    Feb. 11, 2021

(51) Int. Cl.
*H03F 3/187* (2006.01)
*H03F 3/195* (2006.01)
*H03F 1/56* (2006.01)
*H03F 3/24* (2006.01)

(52) U.S. Cl.
CPC ............ *H03F 3/195* (2013.01); *H03F 1/565* (2013.01); *H03F 3/245* (2013.01)

(58) Field of Classification Search
CPC ........................................... H03F 3/187
USPC ................................. 330/302, 307
See application file for complete search history.

(56) References Cited

U.S. PATENT DOCUMENTS

| 10,541,653 | B2* | 1/2020 | Zhu .................. H01L 25/50 |
| 10,742,174 | B2* | 8/2020 | Roberts ............. H01L 23/66 |
| 10,903,795 | B2* | 1/2021 | Miyazawa ............ H03F 3/19 |
| 2004/0085152 | A1 | 5/2004 | Riondet et al. |

(Continued)

FOREIGN PATENT DOCUMENTS

| JP | 2004-523172 A | 7/2004 |
| JP | 2007-060616 A | 3/2007 |
| JP | 2016-158167 A | 9/2016 |

OTHER PUBLICATIONS

Kato et al. "A 83-W, 51 % GaN HEMT Doherty Power Amplifier for 3.5-GHz-Band LTE Base Stations", Oct. 4-6, 2016, Proceedings of the 46th European Microwave Conference, pp. 572-575.

(Continued)

*Primary Examiner* — Henry Choe
(74) *Attorney, Agent, or Firm* — Studebaker & Brackett PC (57) ABSTRACT

The present invention relates to a high-frequency power amplifier in which mainly an amplification GaN chip and a GaAs chip which has a pre-match circuit for the former formed thereon are connected by wires on an identical metal plate. The high-frequency power amplifier according to the present invention is provided with a coupler exhibiting a mutual inductance of a subtractive polarity on the GaAs chip, thereby making it possible to: cancel a mutual inductance between adjacent wires; reduce the spread of a second harmonic impedance with respect to a frequency when a signal source is viewed from a gate terminal of the GaN chip; and maintain a high efficiency of the power amplifier in a desired fundamental wave band.

10 Claims, 8 Drawing Sheets

(56) References Cited

U.S. PATENT DOCUMENTS

2007/0024371 A1    2/2007  Gotou et al.
2016/0247798 A1    8/2016  Sasaki

OTHER PUBLICATIONS

International Search Report; Written Opinion; and Notification of Transmittal of The International Search Report and the Written Opinion of the International Searching Authority, or the Declaration issued in PCT/JP2018/015689; dated Jun. 26, 2018.

* cited by examiner

HIGH-FREQUENCY POWER AMPLIFIER

FIELD

The present invention relates to a high-frequency power amplifier in which mainly an amplification transistor using a GaN HEMT and a GaAs semiconductor which has a pre-match circuit for the former formed thereon are connected by wires on an identical metal plate.

BACKGROUND

In recent years, a high-frequency power amplifier, which uses a GaN high electron mobility transistor (HEMT) that can operate at a higher power supply voltage than a conventional GaAs transistor or Si LDMOS transistor by utilizing the feature of a wide band gap, has been increasingly used also in a consumer sector. One of major fields thereof is that of a high-frequency power amplifier used for a mobile phone base station. As it has an operating frequency of about 1 to 5 GHz in most cases and can operate at a high power supply voltage of 28 to 50 V normally, the same output power can be realized by using a transistor with a smaller gate width as compared with conventional GaAs and Si transistors. A small gate width leads to loss reduction in impedance matching to 50Ω that is the standard impedance, and to loss reduction in power distribution/synthesis. Therefore, the high-frequency power amplifier using a GaN HEMT has a feature of being capable of high-gain and high efficiency operation as compared with an amplifier using a GaAs or Si transistor (for example, refer to NPL 1).

PRIOR ART

Patent Literature

[PTL 1] JP 2007-60616 A
[PTL 2] JP-T 2004-523172

Non Patent Literature

[NPL 1] 2016 Proceedings of the 46th European Microwave Conference, pp. 572-575, "A 83-W, 51% GaN HEMT Doherty Power Amplifier for 3.5-GHz-Band LTE Base Stations"

SUMMARY

Technical Problem

Figure 9:
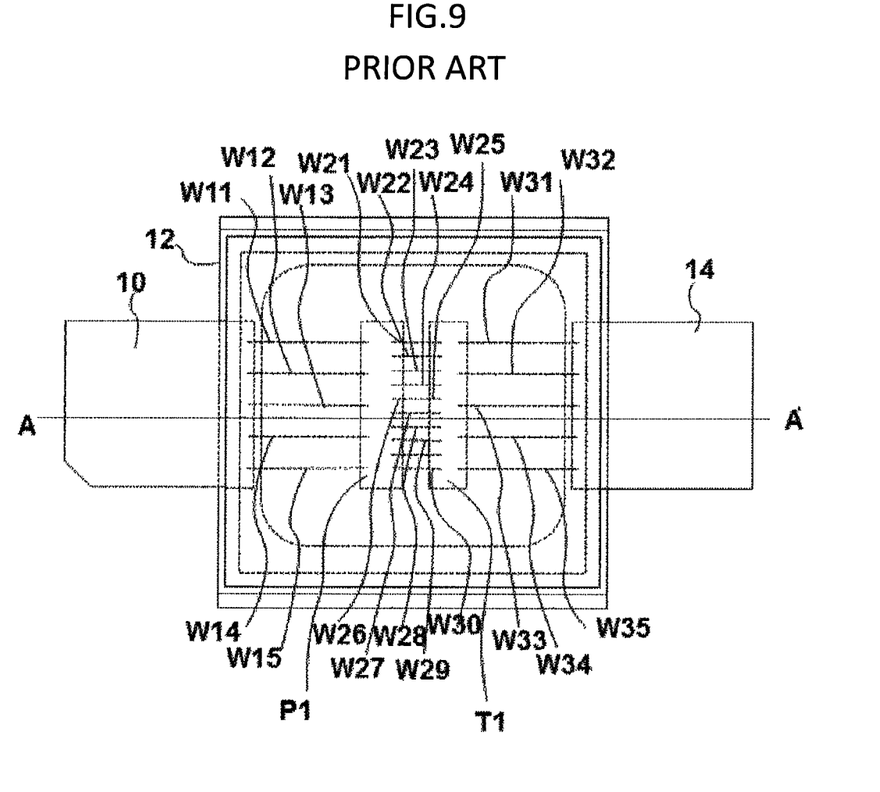
FIG. 9 is a top view of a layout example in a package of a first stage amplifier that uses a conventional GaN HEMT.
Figure 11:
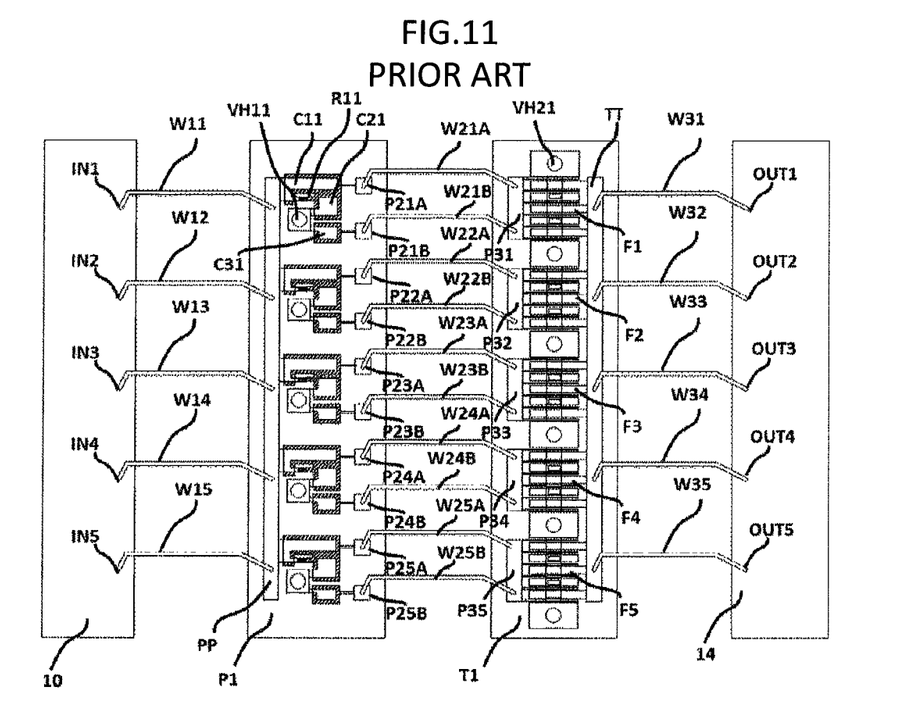
FIG. 11 is a package view including a layout of pre-match part and a GaN HEMT part of the conventional high-frequency power amplifier, and wires.
Figure 12:
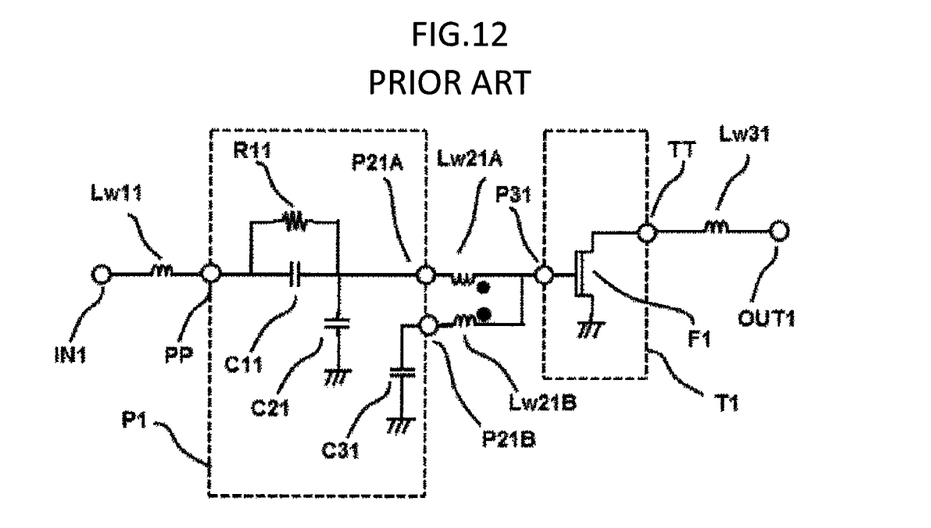
FIG. 12 shows a circuit diagram of the pre-match part of the conventional high-frequency power amplifier.

In PTL 1, PTL 2, and NPL 1, typical examples of a package product of a GaN HEMT used in a power amplifier for a mobile phone base station are shown. In FIG. 9, a top view of an package example in a package of a first stage amplifier that uses a GaN HEMT described in NPL 1; and in FIG. 10, a view of the same package seen from a side are shown. FIG. 11 shows a detailed mounted view including the layouts of a GaN chip (T1) and a GaAs chip (P1); and FIG. 12 shows an equivalent circuit diagram of part of paths in FIG. 11. Here, the GaN chip T1 is constituted of a plurality of pieces of GaN High Electron Mobility Transistor (HEMT) cells, and the GaAs chip P1 plays a role of a pre-match in which a low input impedance of the GaN HEMT is converted into a little higher impedance and a role of maintaining the stability of the entire power amplifier.

In FIG. 9, reference character T1 denotes a GaN HEMT chip; reference character P1 denotes a pre-match GaAs chip; and reference numeral 10 denotes an input lead, which also serves as a gate bias terminal. Reference numeral 14 denotes an output lead, which also serves as a drain bias terminal. Reference numeral 12 denotes a side wall of a ceramic package and a metal plate for heat dissipation. Reference characters W11 to W15 denote wires for connecting an input lead 10 and the GaAs chip P1; reference characters W21 to W30 denote wires for connecting the GaAs chip P1 and gate electrode pads of the GaN chip T1; and reference characters W31 to W35 denote wires for connecting drain electrode pads of the GaN chip T1 and the output lead 14.

Figure 10:
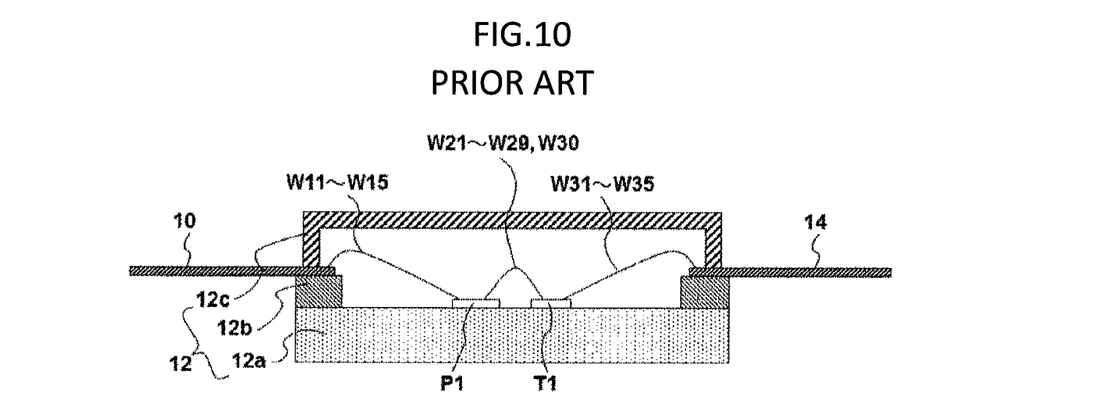
FIG. 10 is a view of the package of FIG. 9 seen from a side.

In FIG. 10, reference character 12a denotes a metal plate that dissipates heat generated in the GaN chip T1 to a lower part of the package and also serves as a ground; reference character 12b denotes an insulator for electrically insulating the leads 10 and 14 from the metal plate 12a; and reference character 12c denotes the side wall of the package and a top face cover.

In FIG. 11, wires W21A, W21B to W25A, and W25B for connecting the GaAs chip P1 and the GaN chip T1 are shown by ten wires of W21 to W30 for simplification in FIG. 9; however, in an actual layout, they are formed in two wires of each A and B as shown in FIG. 11 in many cases. This is derived because, in order to make the power amplifier operate with high efficiency, it is effective to optimize not only a fundamental wave impedance but also a second harmonic impedance in impedances viewed from the gate electrode pads P31 to P35 of the GaN HEMT cells indicated by F1 to F5 in a direction of the input lead 10.

For this optimization, it is more convenient in design optimization to perform division into a path for a fundamental wave (for example, a route of W21A) and a path for a second harmonic (for example, a route of W21B); and therefore, in FIG. 11, pads on the GaAs chip P1 are also divided into pads P21A, P21B to P25A, and P25B so as to correspond to W21A, W21B to W25A, and W25B. Reference characters VH 11 and VH 21 denote via holes formed on the GaAs chip P1 and the GaN chip T1, respectively; each of which connects a ground electrode on a chip rear face and a ground metal on a chip front face. Although via holes at all positions are not indicated by reference signs to avoid complexity on the drawing, circles of the same shape indicate via holes.

In addition, reference character PP denotes an input pad of the GaAs chip P1; reference character TT denotes the drain electrode pad of the GaN chip T1. In addition, reference characters IN1 to IN5 each indicates a connection point of each of the wires W11 to W15 with the input pad 10; and reference characters OUT1 to OUT5 each indicates a connection point of each of the wires W31 to W35 with the output pad 14.

An equivalent circuit in FIG. 12 indicates an equivalent circuit of a path from the connection points IN1 to OUT1 in FIG. 11. In FIG. 12, reference characters Lw11, Lw21A, Lw21B, and Lw31 each shows an inductor formed by each of wires W11, W21A, W21B, and W31 in FIG. 11. A resistor R11 and a capacitor C11 form a stabilization circuit; the inductor Lw21A and a capacitor C21 form a pre-match circuit for a fundamental wave; and the inductor Lw21B and a capacitor C31 form a second harmonic short circuit. By this second harmonic short circuit, efficiency in power amplification operation of the GaN HEMT cell F1 can be improved in comparison with a case where the second harmonic short circuit is not provided. The resistor R11 and the capacitors C11 to C31 shown in FIG. 12 correspond to reference signs indicated on the chip layout in FIG. 11.

Figure 13:
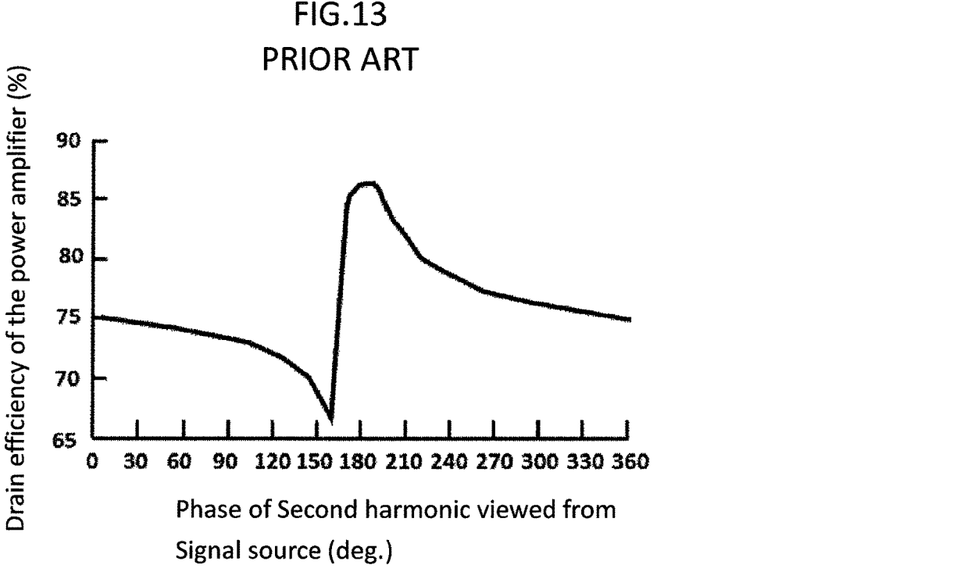
FIG. 13 shows an example of simulating the drain efficiency of the power amplifier through a path in changing a reflection phase in a state where the magnitude of a reflection coefficient of the second harmonic impedance viewed from the gate electrode pad of the GaN HEMT of FIG. 12 in a direction of the connection point is assumed to be approximately 1 (total reflection).

FIG. 13 shows an example of simulating the drain efficiency of the power amplifier through a path IN1 to OUT1 in changing a reflection phase in a state where the magnitude of a reflection coefficient of the second harmonic impedance viewed from the gate electrode pad P31 of the GaN HEMT (F1) in a direction of the connection point IN1 is assumed to be approximately 1 (total reflection). In the simulation, the magnitude and phase of the reflection coefficient are ideally changed in the gate electrode pad P31 and therefore, the inductor Lw21B and the capacitor C3 in FIG. 12 are not included. As shown in FIG. 13, the drain efficiency of the amplifier is changed by the second harmonic reflection phase and normally, a maximum value is shown at around 180°.

Figure 14:
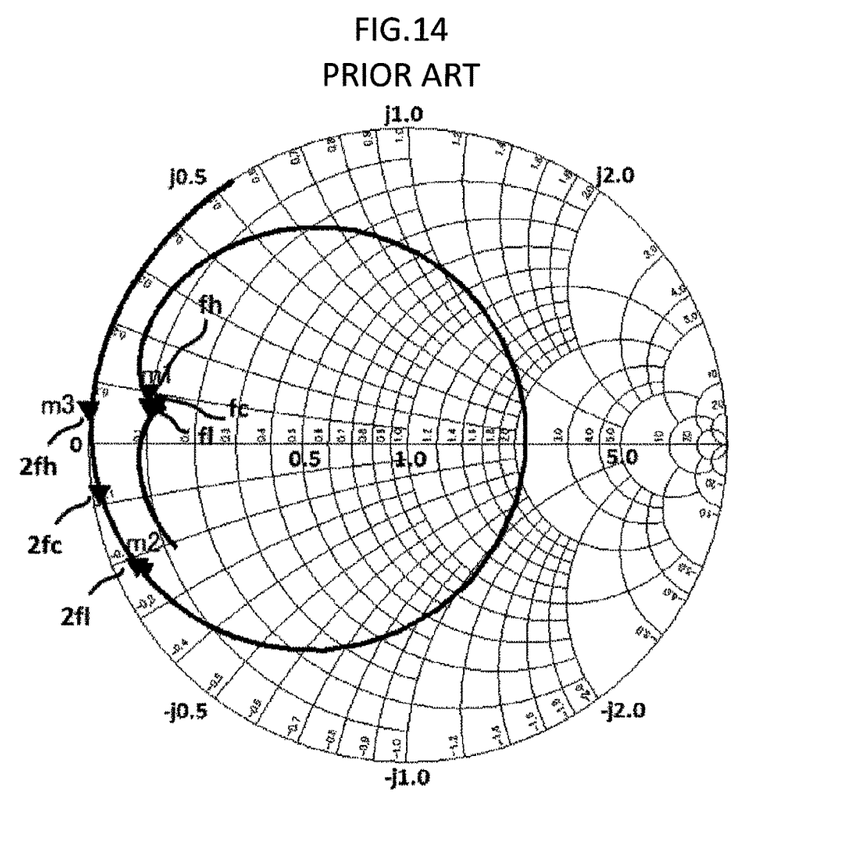
FIG. 14 shows the locus of an impedance when a signal source side is viewed from the gate electrode pad of the GaN HEMT of the high-frequency power amplifier of FIG. 12.

FIG. 14 shows an example of the locus of an impedance viewed from the gate electrode pad P31 in the direction of the connection point IN1 in the equivalent circuit in FIG. 12. It can be seen that the impedance in a fundamental wave band fl to fh (fc is a center frequency) is concentrated at almost one point while the locus of the impedance in the second harmonic band ($2fl$ to $2fh$; $2fc$ is a center) significantly spreads. This spread is out of a range in which a maximum efficiency can be obtained at 170° to 190° shown in FIG. 13; and there exists a problem of being unable to perform a high-efficiency operation over a target band.

Means for Solving the Problems

According to a present invention, a high-frequency power amplifier includes a field-effect transistor (F1) including a gate terminal (P31), a source terminal, and a drain terminal (TT), the field-effect transistor being for amplifying a high-frequency fundamental wave signal, a first semiconductor chip (T1) on which the field-effect transistor (F1) is formed, a pre-match circuit including a first input terminal (PP) and a first output terminal (N11) for input-side fundamental wave matching of the field-effect transistor (F1), a second harmonic short circuit capacitor (C31) including an input-side second harmonic short circuit terminal (N12) of the field-effect transistor, a first coupler (CPL1) including a second input terminal (same portion as N11) connected with the first output terminal (N11), a third input terminal (same portion as N12) connected with the input-side second harmonic short circuit terminal (N12), a second output terminal (P21A) through which a signal from the second input terminal is output, and a third output terminal (P21B) through which a signal is output from the third input terminal, the coupler exhibiting a mutual inductance of a subtractive polarity when signals are simultaneously input from the second input terminal and the third input terminal, a second semiconductor chip (P1) on which the pre-match circuit, the second harmonic short circuit capacitor, and the coupler are formed, a first wire (W21A) connecting the second output terminal and the gate terminal, and a second wire (W21B) connecting the third output terminal and the gate terminal and exhibiting a mutual inductance of an additive polarity with the first wire.

Advantageous Effects of Invention

The high-frequency power amplifier according to the present invention can reduce, when the amplification transistor using the GaN HEMT and the GaAs semiconductor which has a pre-match circuit for the former formed thereon are mainly connected by wires on an identical metal plate, the spread of the second harmonic impedance with respect to the fundamental wave band when viewed from the GaN HEMT gate electrode pad in the direction of the input lead; thereby providing an effect of being capable of a high efficiency operation within the fundamental band.

DESCRIPTION OF EMBODIMENTS

A high-frequency power amplifier according to embodiments of the present invention will be described with reference to drawings. Including drawings already described, identical or corresponding components are denoted by identical reference signs and repeated descriptions may be omitted. In the following, description will be made by using as an example of a high-frequency power amplifier in which an amplification transistor using a GaN HEMT and a GaAs semiconductor which has a pre-match circuit for the former formed thereon are connected by wires.

First Embodiment

Description of Configuration

Figure 1:
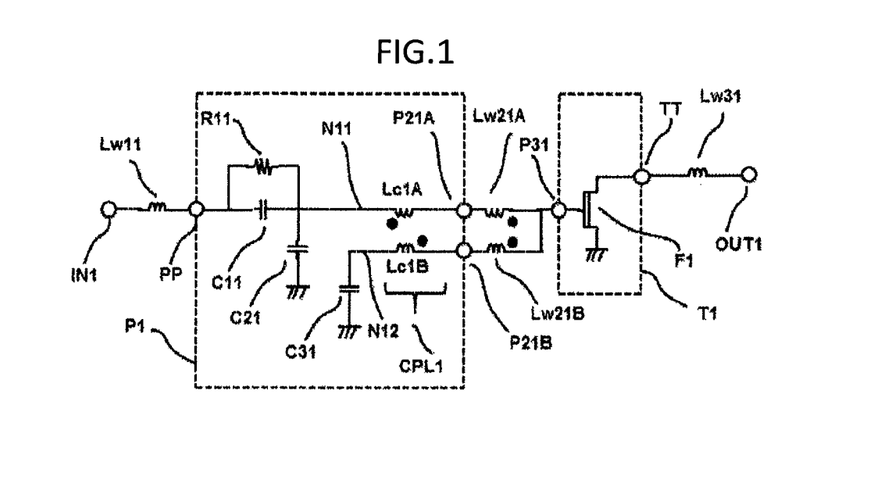
FIG. 1 is a circuit configuration of a pre-match part of a high-frequency power amplifier according to a first embodiment.

FIG. 1 shows a circuit configuration of a pre-match part of a high-frequency power amplifier according to a first embodiment of the present invention. A significant difference from that in FIG. 11 described earlier is that a coupler CPL1 constituted of inductors Lc1A and Lc1B exhibiting a mutual inductance of a mutual subtractive polarity is provided before inductors Lw21A and Lw21B, that is, on an immediately left side of pads P21A and P21B of wires W21A and W21B, on a GaAs chip P1.

Figure 2:
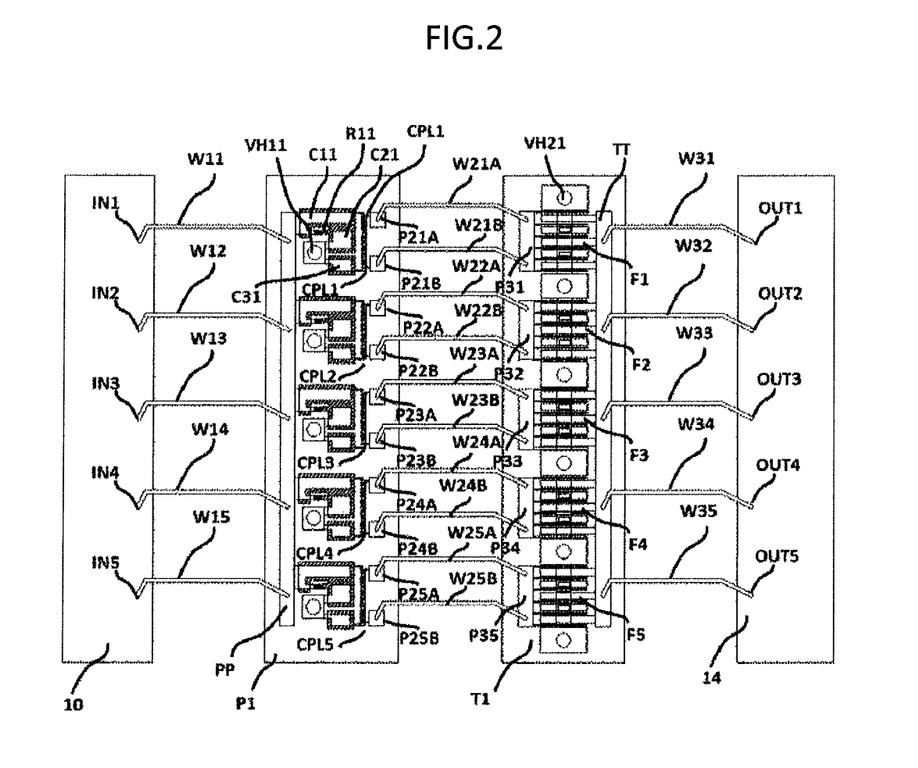
FIG. 2 is a package view that includes the layouts and wires of the pre-match part and a GaN HEMT part of the high-frequency power amplifier according to the first embodiment.

FIG. 2 is an package view that includes the layouts and wires of the pre-match part and a GaN HEMT part of the high-frequency power amplifier according to the first embodiment. Couplers CPL1 to CPL5, which are characteristics of the present invention, are provided on paths IN1 to OUT1, IN2 to OUT2, IN3 to OUT3, IN4 to OUT4, and IN5 to OUT5, respectively. Their positions are arranged so as to be adjacent to pads P21A and P21B, P22A and P22B, P23A and P23B, P24A and P24B, and P25A and P25B on the GaAs chip P1, respectively so as to minimize an increase in the size of the GaAs chip P1.

Figure 3:
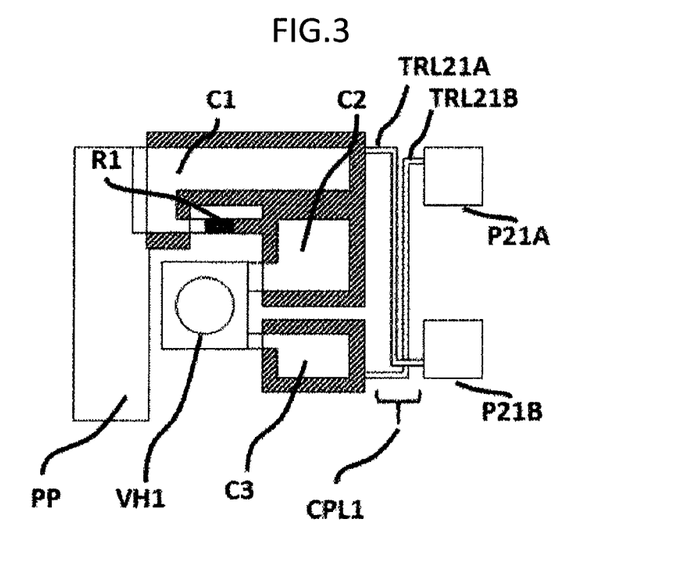
FIG. 3 is an enlarged view of the layout of the coupler part provided in the pre-match part of a high-frequency power amplifier according to the first embodiment.

FIG. 3 is an enlarged view of the layout of the coupler part CPL1. The coupler CPL1 is constituted of parallelly arranged transmission lines (here, microstrip lines) TRL21A and TRL21B; and the transmission line TRL21B connected to the pad P21A is connected to a capacitor C3 and the transmission line TRL21A connected to the pad P21B is connected to capacitors C1 and C2 so that electromagnetic coupling exhibits a subtractive polarity.

Description of Operation

First, a factor of the problem that the impedance locus of a second harmonic band spreads will be described. As shown in a layout view of FIG. 11 and an equivalent circuit in FIG. 12, a plurality of wires (W21A to W25B) connecting between the GaAs chip P1 and the GaN chip T1 are adjacent and in parallel to each other. Due to this adjacency and parallelism, electromagnetic coupling is generated between adjacent wires. This coupling exhibits a mutual inductance of an additive polarity as seen by dots with which the inductors Lw21A and Lw21B in FIG. 12 are marked. However, the inductor Lw21A is connected to a fundamental wave pre-match and Lw21B is connected to a second harmonic short circuit capacitor C31. Therefore, the frequencies of flowing currents are seemingly different and so, there seems no direct influence. Here, the short circuit ideally refers to 0Ω; however, it should be noted that even a second harmonic impedance that is one fifth as compared with a fundamental wave impedance does not cause a problem in practice.

Figure 4:
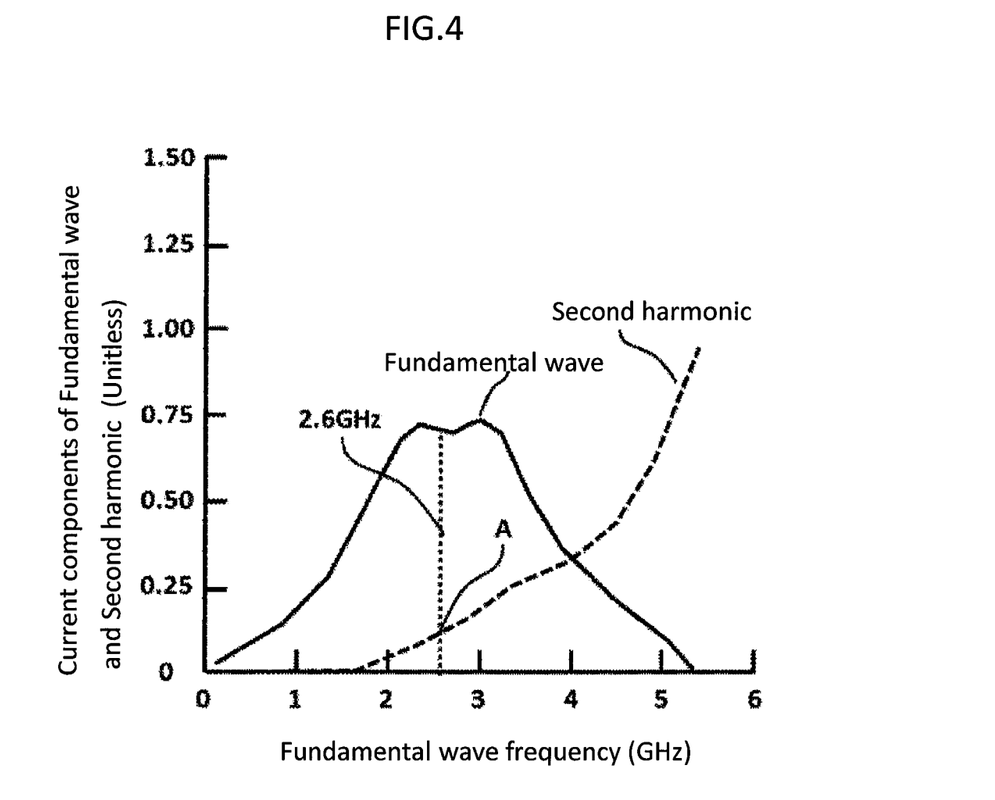
FIG. 4 is simulation results of fundamental wave and second harmonic current components that flow through an inductor in FIG. 10 for comparison with the first embodiment.
Figure 5:
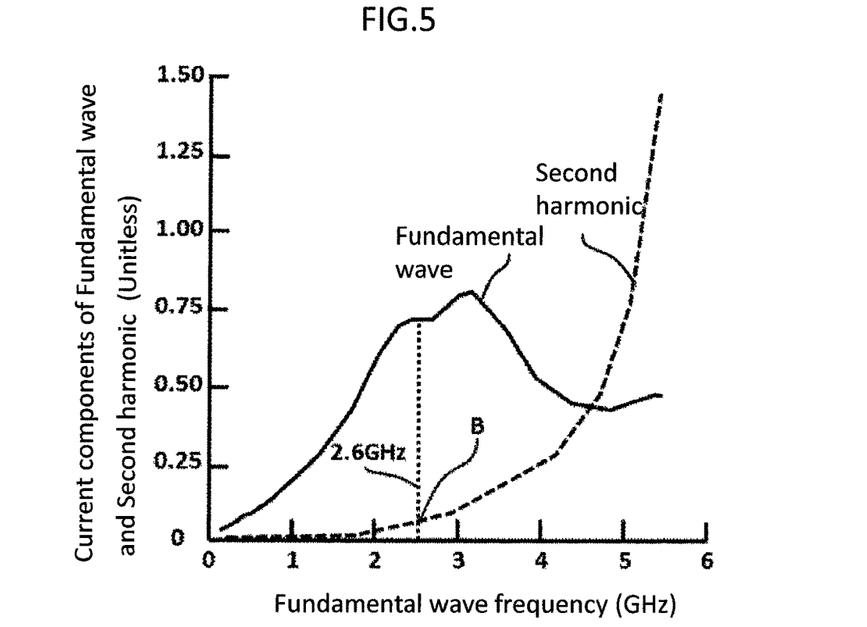
FIG. 5 is simulation results of fundamental wave and second harmonic current components that flow through the inductor according to the first embodiment.

FIG. 4 is simulation results of a fundamental wave current component and a second harmonic current component that flow through the inductor Lw21A of a circuit in FIG. 12. For example, in the circuit in FIG. 12 in which a fundamental wave center frequency is set to 2.6 GHz, the fundamental wave current component and second harmonic current component that flow through the inductor Lw21A are 0.7 and 0.12, respectively; the second harmonic current component, which is as relatively large as approximately 17% of the fundamental current component, flows through the inductor Lw21A. As a result, it is found that second harmonic current components flowing through the inductors Lw21A and Lw21B are added with mutually additive polarities, thereby increasing a change in the second harmonic impedance.

Thus, considering that the second harmonic current component also flows through the fundamental wave pre-match path, the coupler CPL1 having a subtractive polarity is connected to the inductors Lw21A and Lw21B exhibiting a positive polarity, in FIG. 1. By appropriately setting a mutual inductance of a subtractive polarity in the coupler CPL1, the inductance of the second harmonic current which is effectively increased due to the additive polarity of the inductors Lw21A and Lw21B can be effectively cancelled by the coupler CPL1 having a mutual inductance of a subtractive polarity, thus allowing an increase in the inductance of the second harmonic current flowing through Lw21A and Lw21B to be prevented.

Figure 6:
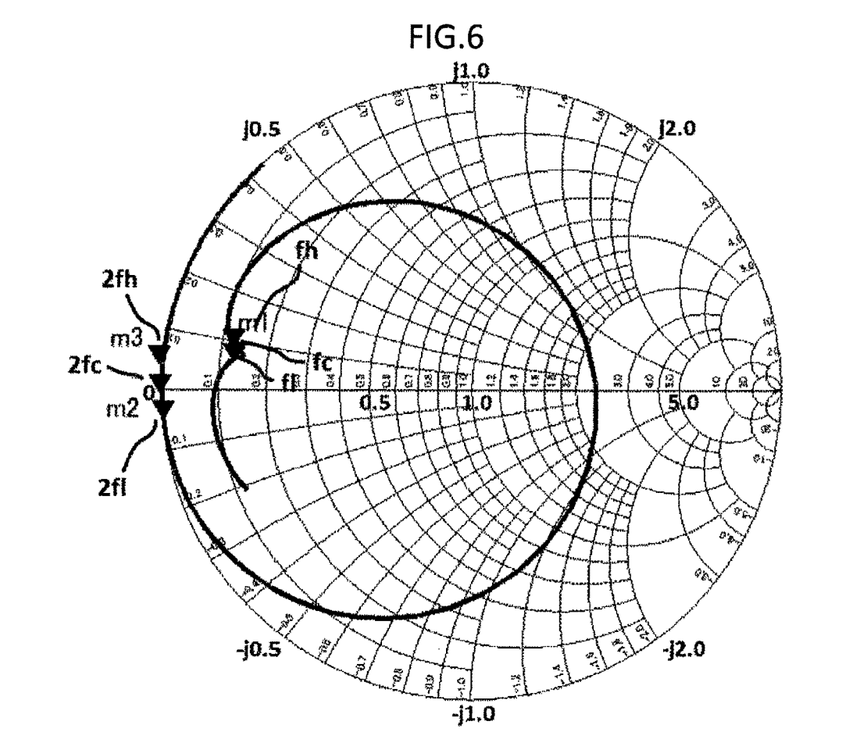
FIG. 6 shows the locus of impedance when the connection point is viewed from the gate electrode pad of the GaN HEMT of the high-frequency power amplifier according to the first embodiment.

FIG. 6 shows an example of the locus of impedance viewed from the gate electrode pad P31 in the direction of the connection point IN1 in FIG. 1. It can be seen that not only the impedance in a fundamental wave band fl to fh (fc is a center frequency) is concentrated at almost one point, but also the spread of the locus of the impedance in the second harmonic band ($2fl$ to $2fh$; $2fc$ is a center) is significantly reduced in comparison with FIG. 14.

In PTL 2, an example is described in which an increase in an inductance of a wire is cancelled by a folded-back wire for fundamental wave matching. On the other hand, the present invention is different in that in order to cancel a mutual inductance of an additive polarity with respect to a second harmonic, a coupler exhibiting a mutual inductance of a subtracting polarity is formed on a chip. By forming the coupler on a chip, such an effect is provided that the magnitude of a mutual inductance of a subtracting polarity with respect to a second harmonic can be appropriately set by a layout without receiving a restriction on, for example, a wire length.

Effects of First Embodiment

As described above, by providing, on the GaAs chip P1, the coupler CPL1 exhibiting a mutual inductance of a subtractive polarity according to a high-frequency power amplifier of the first embodiment, the spread of the second harmonic impedance can be reduced and a high efficiency of the power amplifier in a desired fundamental wave band can be maintained.

Although, in the examples shown in FIG. 1 and FIG. 2, the coupler exhibiting a mutual inductance of a subtractive polarity is formed on the GaAs chip P1, it is only required that influences of the additive polarity of the inductors Lw21A and Lw21B are cancelled and therefore, by providing the coupler CPL1 on the GaN chip T1, that is, between right ends of Lw21A and Lw21B and the gate electrode pad P31, the effect of reducing the spread of the second harmonic impedance can also be obtained. In addition, it may be possible that the coupler CPL1 is divided and provided on both the GaAs chip P1 and the GaN tip T1.

Furthermore, in FIG. 2 and FIG. 3, description has been made by using an example of the coupler CPL1 that utilizing edge coupling between microstrip lines; however, in a case where multilayer wiring can be used, the same effect as described above can be obtained even by using broadside coupling in which lines are arranged at top and bottom or using coupling that uses spiral inductors instead of simple microstrip lines.

SECOND EMBODIMENT

Figure 7:
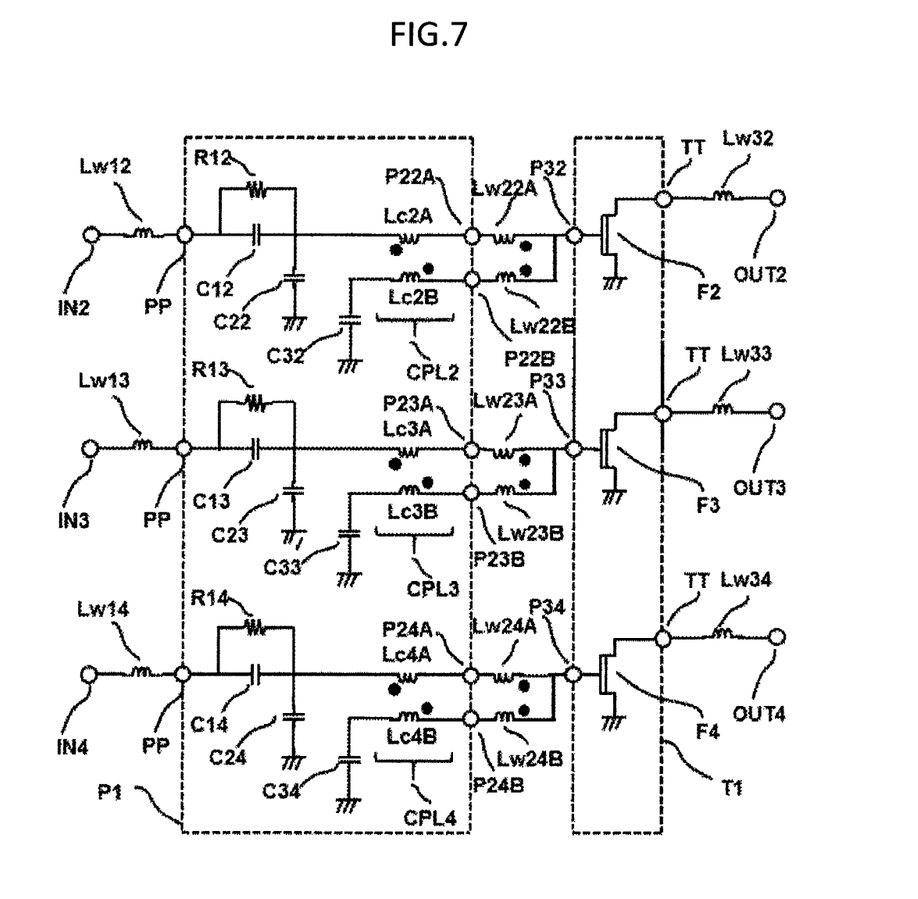
FIG. 7 shows a circuit configuration of a pre-match part of a high-frequency power amplifier according to a second embodiment.
Figure 8:
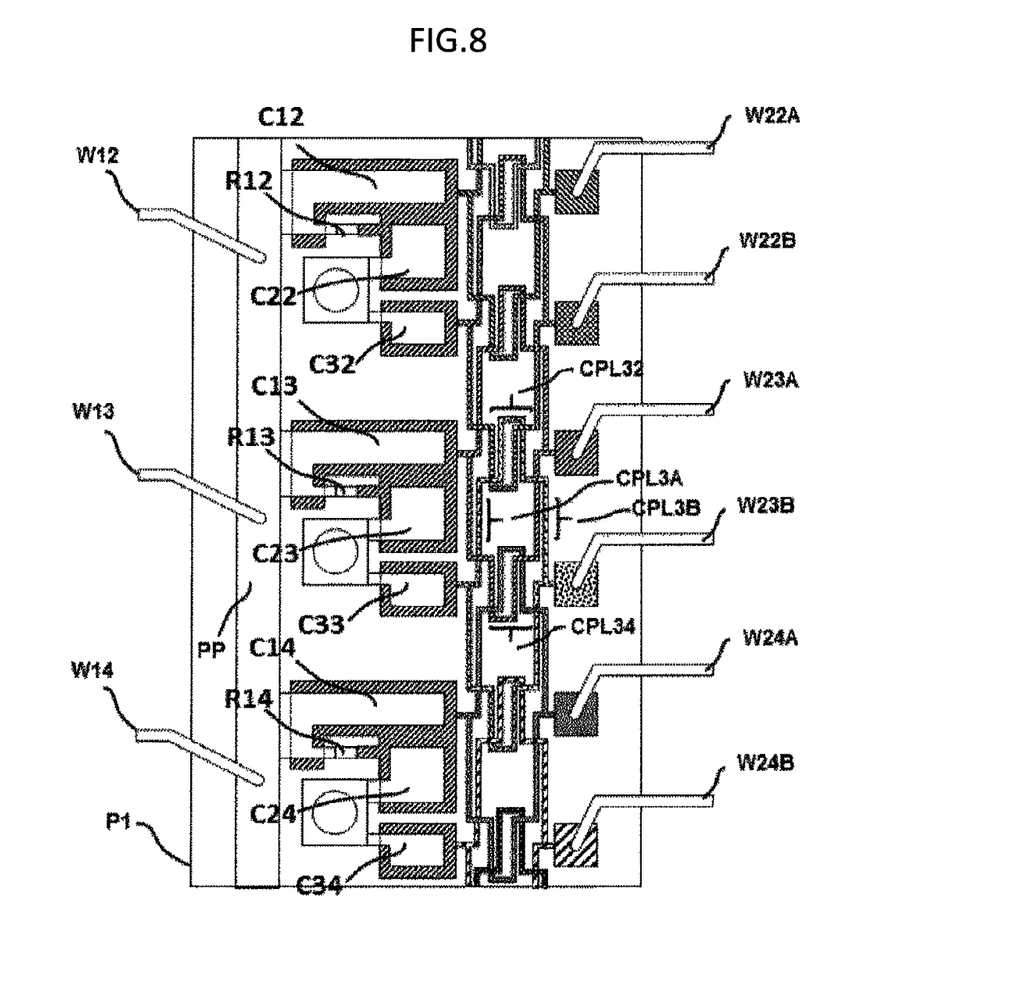
FIG. 8 is an enlarged layout view of the pre-match part of a high-frequency power amplifier according the second embodiment.

FIG. 7 shows a circuit configuration of a pre-match part of a high-frequency power amplifier according to a second embodiment of the present invention and shows an equivalent circuit of part corresponding to paths of IN2 to OUT2, IN3 to OUT3, and IN4 to OUT4 in FIG. 2. FIG. 8 is an enlarged layout view of the pre-match part according the second embodiment. In FIG. 7 and FIG. 8, reference characters R12 to R14 denote resistors; reference characters C12 to C14, C22 to C24, and C32 to C34 denote capacitors; reference characters Lw22A, Lw22B, Lw23A, Lw23B, Lw24A, and Lw24B denote inductors, respectively corresponding to wires W22A, W22B, W23A, W24A, and W24B which are shown in FIG. 2 and FIG. 8.

In addition, a coupler CPL2 constituted of inductors Lc2A and Lc2B, a coupler CPL3 constituted of the inductors Lc3A and Lc3B, and a coupler CPL4 constituted of inductors Lc4A and Lc4B are couplers that exhibit a mutual inductance of a subtractive polarity described in the first embodiment.

In the first embodiment, an example is shown in which an increase of an inductance due to electromagnetic coupling between a fundamental wave pre-match wire W2xA and a second harmonic short circuit wire W2xB in one path out of INx to OUTx (x=1 to 5) is reduced by a coupler CPLx.

In the second embodiment, an example is provided in which an increase of an inductance is cancelled in consideration of electromagnetic coupling with not only one path but also an adjacent neighboring path. FIG. 8 is its concrete layout example.

In FIG. 8, couplers CPL3A and CPL3B are couplers having the same subtractive polarity as in the first embodiment, shown by CPL3 in FIG. 7. In FIG. 8, in addition to them, couplers CPL32 and CPL34 are provided. The coupler CPL32 is a coupler for cancelling electromagnetic coupling between the inductor Lw23A and the inductor Lw22B on an adjacent path in FIG. 7. In addition, the coupler CPL34 is a coupler for cancelling electromagnetic coupling between the inductor Lw23B and the inductor Lw24A on an adjacent path in FIG. 7. Existence of such magnetic coupling from an adjacent path can be understood from a fact that signals with an identical phase pass through adjacent wires as shown in FIG. 2 and FIG. 8.

In addition, like the couplers CPL32 and CPL34 shown in FIG. 8, an influence of electromagnetic coupling from wires on adjacent paths can also be canceled and an amount by which mutual inductance can be appropriately canceled by a layout design of couplers on a chip can be set, which are different from PTL 2.

Effects of Second Embodiment

As described above, by providing, on the GaAs chip P1, the coupler which is arranged so as to cancel electromagnetic coupling from adjacent another path according to the second embodiment, the spread of the second harmonic impedance can be more effectively reduced than in the first embodiment and a high efficiency of the power amplifier in a desired fundamental wave band can be maintained.

In addition, as mentioned in the description of the first embodiment, by dividing a coupler exhibiting a mutual inductance of a subtractive polarity and providing it on the GaN chip T1 or providing it on both the GaAs chip P1 and the GaN chip T1, the same effect can also be obtained.

Furthermore, in FIG. 8, description has been made by using an example of utilizing edge coupling between microstrip lines; however, in a case where multilayer wiring can be used, the same effect as described above can be obtained even by using broadside coupling in which lines are arranged at top and bottom or using coupling that uses spiral inductors instead of simple microstrip lines.

It should be noted that although the embodiments mentioned above have been described by using examples in a case where connection between the GaN HEMT and its pre-match circuit on the GaAs chip is performed by wires, the GaN HEMT may be a GaAs HEMT or GaAs FET. In addition, for formation of the pre-match circuit, any semiconductor process capable of forming capacitors, resistors, and coupling lines can be applied; and especially in consideration of low substrate loss characteristics at a high-frequency, it is needless to say that it is available on not only a GaN chip or GaAs chip for which a high-resistance substrate can be used, but also a Silicon-on-Insulator (SOI) chip, a Silicon-on-Sapphire (SOS) chip, or an Integrated Passive Device (IPD) chip for which a semiconductor process is applied on a glass substrate.

Furthermore, when an SOI is used for a substrate on which a pre-match circuit is formed, a substrate resistivity is in a range of approximately 1 kΩ cm to 10 kΩ cm and therefore, when compared with a GaN HEMT process on a SiC substrate and a resistivity of 1 Mcm of a GaAs substrate, a circuit loss increases in a slightly high-frequency band but costs can be kept low. An IPD using a glass substrate costs the same as an SOI and its resistivity is as high as 1 Mcm. However, thermal conductivity is low and therefore, if heat generation in a pre-match circuit is high, a circuit loss of the pre-match circuit slightly increases in comparison with the SiC substrate and GaAs substrate.

DESCRIPTION OF SYMBOLS

T1: GaN chip
P1: GaAs chip
F1-F5: GaN HEMT
10: input lead
14: output lead
12: side wall of the ceramic package, metal plate for heat dissipation
12a: metal plate
12b: insulator for electrically insulating the leads 10 and 14 from the metal plate 12a
12c: side wall of the package, top face cover
W11-W15: wires for connecting input lead 10 with GaAs chip P1
W21-W30: wires for connecting GaAs chip P1 with GaN chip T1
W31-W35: wires for connecting drain electrode pads of GaN chip T1 with output lead 14
W21A, W21B-W25A, W25B: wire for connecting GaAs chip P1 with GaN chip T1
P31-P35: gate electrode pad
P21A, P21B, P22A, P22B, P23A, P23B, P24A, P24B, P25A, P25B: pads on GaAs chip for the wire connected with GaN chip
VH 11, VH21: via holes
PP: input pad of GaAs chip P1
TT: drain electrode pad of GaN chip T1
IN1-IN5: connection points of wires W11-W15 with the input pad 10
OUT1-OUT5: connection points of wires W31-W35 with the output pad 14
R11-R13: resistor
C11-C31, C21-C34, C31-C34, C41-C44: capacitor
Lw21A, Lw21B, Lw22A, Lw22B, Lw23A, Lw23B, Lw24A, Lw24B, Lw25A, Lw25A: inductance of wire Lc1A, Lc1B, Lc2A, Lc2B, Lc3A, Lc3B, Lc4A, Lc4B: inductance of coupler CPL1-CPL5, CPL3A, CPL3B, CPL32, CPL34: coupler formed on the chip exhibiting a mutual inductance of a subtractive polarity N11: connection point of fundamental wave pre-match with coupler N12: connection point of second harmonic short circuit capacitor C31 with coupler

The invention claimed is:

1. A high-frequency power amplifier, comprising:
a field-effect transistor including a gate terminal, a source terminal, and a drain terminal, the field-effect transistor being for amplifying a high-frequency fundamental wave signal;
a first semiconductor chip on which the field-effect transistor is formed;
a pre-match circuit including a first input terminal and a first output terminal for input-side fundamental wave matching of the field-effect transistor;
a second harmonic short circuit capacitor including an input-side second harmonic short circuit terminal of the field-effect transistor;
a coupler including a second input terminal connected with the first output terminal, a third input terminal connected with the input-side second harmonic short circuit terminal, a second output terminal through which a signal from the second input terminal is output, and a third output terminal through which a signal is output from the third input terminal, the coupler exhibiting a mutual inductance of a subtractive polarity when signals are simultaneously input from the second input terminal and the third input terminal;
a second semiconductor chip on which the pre-match circuit, the second harmonic short circuit capacitor, and the coupler are formed;
a first wire connecting the second output terminal and the gate terminal; and
a second wire connecting the third output terminal and the gate terminal and exhibiting a mutual inductance of an additive polarity with the first wire.

2. The high-frequency power amplifier according to claim 1, wherein
the first semiconductor chip is a GaN HEMT chip and the second semiconductor chip is a GaAs chip.

3. The high-frequency power amplifier according to claim 1, wherein
the first semiconductor chip is a GaN HEMT chip and the second semiconductor chip is an SOI chip.

4. The high-frequency power amplifier according to claim 1, wherein
the first semiconductor chip and the second semiconductor chip are both GaAs chips.

5. The high-frequency power amplifier according to claim 1, wherein
the second semiconductor chip is an IPD chip.

6. A high-frequency power amplifier, comprising:
a first high-frequency power amplifier having the same structure as the high-frequency power amplifier of claim 1,
a second high-frequency power amplifier having the same structure as the high-frequency power amplifier of claim 1, and
an additional coupler, wherein
the second wire of the first high-frequency power amplifier and the first wire of the second high-frequency power amplifier adjoin with each other, thereby exhibiting an additional mutual inductance of an additive polarity, and
the additional coupler configured to exhibit a mutual inductance that cancels the additional mutual inductance of an additive polarity.

7. The high-frequency power amplifier according to claim 6, wherein
the first semiconductor chip is a GaN HEMT chip and the second semiconductor chip is a GaAs chip.

8. The high-frequency power amplifier according to claim 6, wherein
the first semiconductor chip is a GaN HEMT chip and the second semiconductor chip is an SOI chip.

9. The high-frequency power amplifier according to claim 6, wherein
the first semiconductor chip and the second semiconductor chip are both GaAs chips.

10. The high-frequency power amplifier according to claim 6, wherein
the second semiconductor chip is an IPD chip.

* * * * *